(12) United States Patent
Rothstein et al.

(10) Patent No.: US 11,763,181 B2
(45) Date of Patent: *Sep. 19, 2023

(54) METROLOGY AND PROCESS CONTROL FOR SEMICONDUCTOR MANUFACTURING

(71) Applicant: NOVA LTD, Rehovot (IL)

(72) Inventors: Eitan Rothstein, Rehovot (IL); Ilya Rubinovich, Rehovot (IL); Noam Tal, Rehovot (IL); Barak Bringoltz, Rehovot (IL); Yongha Kim, Rehovot (IL); Ariel Broitman, Rehovot (IL); Oded Cohen, Rehovot (IL); Eylon Rabinovich, Rehovot (IL); Tal Zaharoni, Rehovot (IL); Shay Yogev, Rehovot (IL); Daniel Kandel, Rehovot (IL)

(73) Assignee: NOVA LTD, Rehovot (IL)

( * ) Notice: Subject to any disclaimer, the term of this patent is extended or adjusted under 35 U.S.C. 154(b) by 105 days.

This patent is subject to a terminal disclaimer.

(21) Appl. No.: 17/400,157

(22) Filed: Aug. 12, 2021

(65) Prior Publication Data

US 2022/0036218 A1 Feb. 3, 2022

Related U.S. Application Data

(63) Continuation of application No. 16/973,092, filed as application No. PCT/IB2019/054994 on Jun. 14, 2019, now Pat. No. 11,093,840.

(Continued)

(51) Int. Cl.
*G06N 5/04* (2023.01)
*H01L 21/66* (2006.01)
(Continued)

(52) U.S. Cl.
CPC .............. *G06N 5/04* (2013.01); *G01B 11/06* (2013.01); *G03F 7/705* (2013.01);
(Continued)

(58) Field of Classification Search
CPC .......... G06N 5/04; G06N 20/00; G01B 11/06; G01B 2210/56; G03F 7/705; G03F 7/70616; H01L 21/681; H01L 22/26
(Continued)

(56) References Cited

U.S. PATENT DOCUMENTS

2009/0198635 A1   8/2009   Doddi et al.
2013/0305206 A1*  11/2013  Pandev .................. H01L 22/20
                                                          716/136

(Continued)

*Primary Examiner* — Isiaka O Akanbi
(74) *Attorney, Agent, or Firm* — ALPHAPATENT ASSOCIATES, LTD; Daniel J. Swirsky (57) ABSTRACT

A semiconductor metrology system including a spectrum acquisition tool for collecting, using a first measurement protocol, baseline scatterometric spectra on first semiconductor wafer targets, and for various sources of spectral variability, variability sets of scatterometric spectra on second semiconductor wafer targets, the variability sets embodying the spectral variability, a reference metrology tool for collecting, using a second measurement protocol, parameter values of the first semiconductor wafer targets, and a training unit for training, using the collected spectra and values, a prediction model using machine learning and minimizing an associated loss function incorporating spectral variability terms, the prediction model for predicting values for production semiconductor wafer targets based on their spectra.

20 Claims, 8 Drawing Sheets

Related U.S. Application Data

(60) Provisional application No. 62/684,817, filed on Jun. 14, 2018.

(51) Int. Cl.
*G06N 20/00* (2019.01)
*G01B 11/06* (2006.01)
*G03F 7/00* (2006.01)
*H01L 21/68* (2006.01)

(52) U.S. Cl.
CPC ......... *G03F 7/70616* (2013.01); *G06N 20/00* (2019.01); *H01L 21/681* (2013.01); *H01L 22/26* (2013.01); *G01B 2210/56* (2013.01)

(58) Field of Classification Search
USPC .......................................... 356/124, 614–625
See application file for complete search history.

(56) References Cited

U.S. PATENT DOCUMENTS

| | | | |
|---|---|---|---|
| 2014/0316730 A1* | 10/2014 | Shchegrov | H01L 22/12 702/81 |
| 2016/0003609 A1* | 1/2016 | Shchegrov | G03F 7/705 356/625 |
| 2016/0313658 A1* | 10/2016 | Marciano | G03F 7/70616 |
| 2016/0341670 A1* | 11/2016 | Vagos | G01N 21/8851 |
| 2017/0345140 A1 | 11/2017 | Zhang et al. | |
| 2018/0046737 A1* | 2/2018 | Willems | G03F 7/70633 |
| 2018/0067900 A1* | 3/2018 | Mos | G03F 7/70508 |

\* cited by examiner

| Training Set | Wafer | Original Train. | Weighted Train. |
|---|---|---|---|
| First Training (baseline) | W#01 | 1 | 0.13 |
| | W#02 | 1 | 0.16 |
| | W#03 | 1 | 0.19 |
| | W#04 | 1 | 0.23 |
| | W#05 | 1 | 0.29 |
| Second Training (1st update) | W#01 | 1 | 0.03 |
| | W#02 | 1 | 0.04 |
| | W#03 | 1 | 0.05 |
| | W#04 | 1 | 0.06 |
| | W#05 | 1 | 0.08 |
| | W#06 | 1 | 0.09 |
| | W#07 | 1 | 0.12 |
| | W#08 | 1 | 0.14 |
| | W#09 | 1 | 0.17 |
| | W#10 | 1 | 0.21 |

Fig. 7

METROLOGY AND PROCESS CONTROL FOR SEMICONDUCTOR MANUFACTURING

BACKGROUND

Shrinking dimensions and the growing complexity of the today's semiconductor manufacturing process is driving the metrology of such processes to its limits and makes it very hard to keep the metrology tools within the specifications required by the tight process limits. The accuracy, process robustness, precision, matching and other uncertainties involved with the metrology result are very hard to achieve with current methods. In addition, metrics like throughput (TPT) and limitations of within-wafer (WiW) sampling rates are particularly challenging given process control requirements. Finally, obtaining external reference data to train and/or test model-based metrology solutions is increasingly challenging.

Today, these challenges are mitigated primarily by hardware improvements that optimize 'move and measure' (MAM) time, tool stability, and tool reproducibility, which in turn also optimize TPT and sampling rates. Process robustness is currently dealt with by searching, at recipe (i.e., measurement protocol) creation time, for metrology recipes that will be as stable as possible, which may, at times, come at the expense of performance.

SUMMARY

The invention, in embodiments thereof, presents machine learning (ML) methods based on supervised learning. Specifically, given a data set of optical signals, $S_i$, for each measurement sample i (e.g., for each die on a set of semiconductor wafers), and a reference value for a parameter, $P_i$, ML is employed to establish a model for predicting $P^{predicted}$ for any yet to be measured signal $S^{new}$. Model complexity may be varied, and the choice of a model depends on the type and size of the data set used to train the model, the inherent sensitivity of S to P, and the type and amplitude of the noise in the reference metrology in relation to P.

In one aspect of the invention a semiconductor metrology method is provided including collecting, using a spectrum acquisition tool and in accordance with a first measurement protocol, a baseline set of spectra on a first set of semiconductor wafer targets, collecting, using an optical metrology tool and in accordance with a second measurement protocol, values of predefined parameters of the first set of semiconductor wafer targets, for each of one or more predefined sources of spectral variability, collecting a variability set of spectra using the spectrum acquisition tool, and in accordance with the first measurement protocol, on a second set of semiconductor wafer targets corresponding to the first set of semiconductor wafer targets, where the variability set of spectra embodies the spectral variability, and using the collected sets of spectra and parameter values to train a prediction model using machine learning and minimize a loss function associated with the prediction model, where the prediction model is configured to be used to predict values for any of the predefined parameters using production spectra of a third set of semiconductor wafer targets, where the production spectra are collected using the spectrum acquisition tool and in accordance with the first measurement protocol, and where the loss function is minimized by incorporating, for each of the one or more predefined sources of spectral variability, a term representing the spectral variability.

In another aspect of the invention the predefined sources of spectral variability include tool variability.

In another aspect of the invention the collecting the variability spectra includes collecting the variability spectra from a selected one of the semiconductor wafer targets using multiple and identical ones of the spectrum acquisition tool.

In another aspect of the invention the predefined sources of spectral variability include measurement repeatability.

In another aspect of the invention the collecting the variability spectra includes collecting the variability spectra from a selected one of the semiconductor wafer targets using the spectrum acquisition tool at multiple different points in time.

In another aspect of the invention the first and second measurement protocols differ in any of numbers of channels, illumination angles, targets, and signals acquired from the same target.

In another aspect of the invention the method further includes collecting production scatterometric spectra during the fabrication of a production semiconductor wafer, and producing, using the prediction model, a prediction value for any of the predefined parameters based on the production scatterometric spectra.

In another aspect of the invention further includes providing input to a semiconductor manufacturing tool for controlling operation of the semiconductor manufacturing tool during the fabrication of the production semiconductor wafer.

In another aspect of the invention a semiconductor metrology system is provided including a spectrum acquisition tool configured to collect, in accordance with a first measurement protocol, a baseline set of scatterometric spectra on a first set of semiconductor wafer targets, and for each of one or more predefined sources of spectral variability, collect, in accordance with the first measurement protocol, a variability set of scatterometric spectra on a second set of semiconductor wafer targets corresponding to the first set of semiconductor wafer targets, where the variability set of spectra embodies the spectral variability, an optical metrology tool configured to collect, in accordance with a second measurement protocol, values of predefined parameters of the first set of semiconductor wafer targets, and a training unit configured to use the collected sets of spectra and parameter values to train a prediction model using machine learning and minimize a loss function associated with the prediction model, where the prediction model is configured to be used to predict values for any of the predefined parameters using production spectra of a third set of semiconductor wafer targets, where the production spectra are collected using the spectrum acquisition tool and in accordance with the first measurement protocol, and where the loss function is minimized by incorporating, for each of the one or more predefined sources of spectral variability, a term representing the spectral variability.

In another aspect of the invention the predefined sources of spectral variability include tool variability.

In another aspect of the invention the spectrum acquisition tool is configured to collect the variability spectra from a selected one of the semiconductor wafer targets using multiple and identical ones of the spectrum acquisition tool.

In another aspect of the invention the predefined sources of spectral variability include measurement repeatability.

In another aspect of the invention the spectrum acquisition tool is configured to collect the variability spectra from a selected one of the semiconductor wafer targets using the spectrum acquisition tool at multiple different points in time.

In another aspect of the invention the first and second measurement protocols differ in any of numbers of channels, illumination angles, targets, and signals acquired from the same target.

In another aspect of the invention the spectrum acquisition tool is configured to collect production scatterometric spectra during the fabrication of a production semiconductor wafer, and further includes a prediction unit configured to produce, using the prediction model, a prediction value for any of the predefined parameters based on the production scatterometric spectra.

In another aspect of the invention the system further includes a process control unit configured to provide input, based on the prediction value, to a semiconductor manufacturing tool for controlling operation of the semiconductor manufacturing tool during the fabrication of the production semiconductor wafer.

BRIEF DESCRIPTION OF THE DRAWINGS

Aspects of the invention will be understood and appreciated more fully from the following detailed description taken in conjunction with the appended drawings in which.

DETAILED DESCRIPTION

Figure 1A:
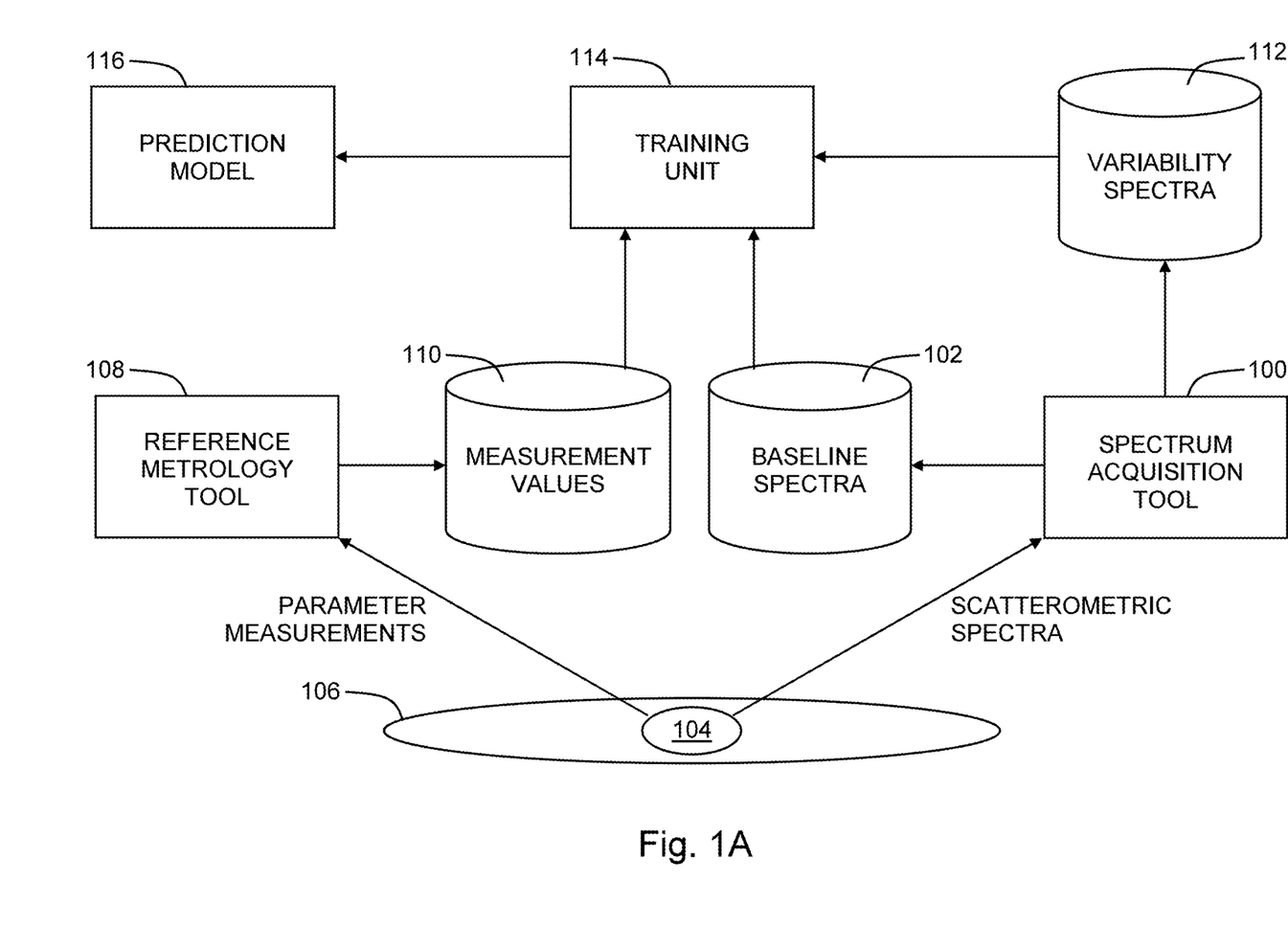
FIGS. 1A and 1B, taken together, is a simplified conceptual illustration of a system for semiconductor metrology and process control, constructed and operative in accordance with an embodiment of the invention.
Figure 1B:
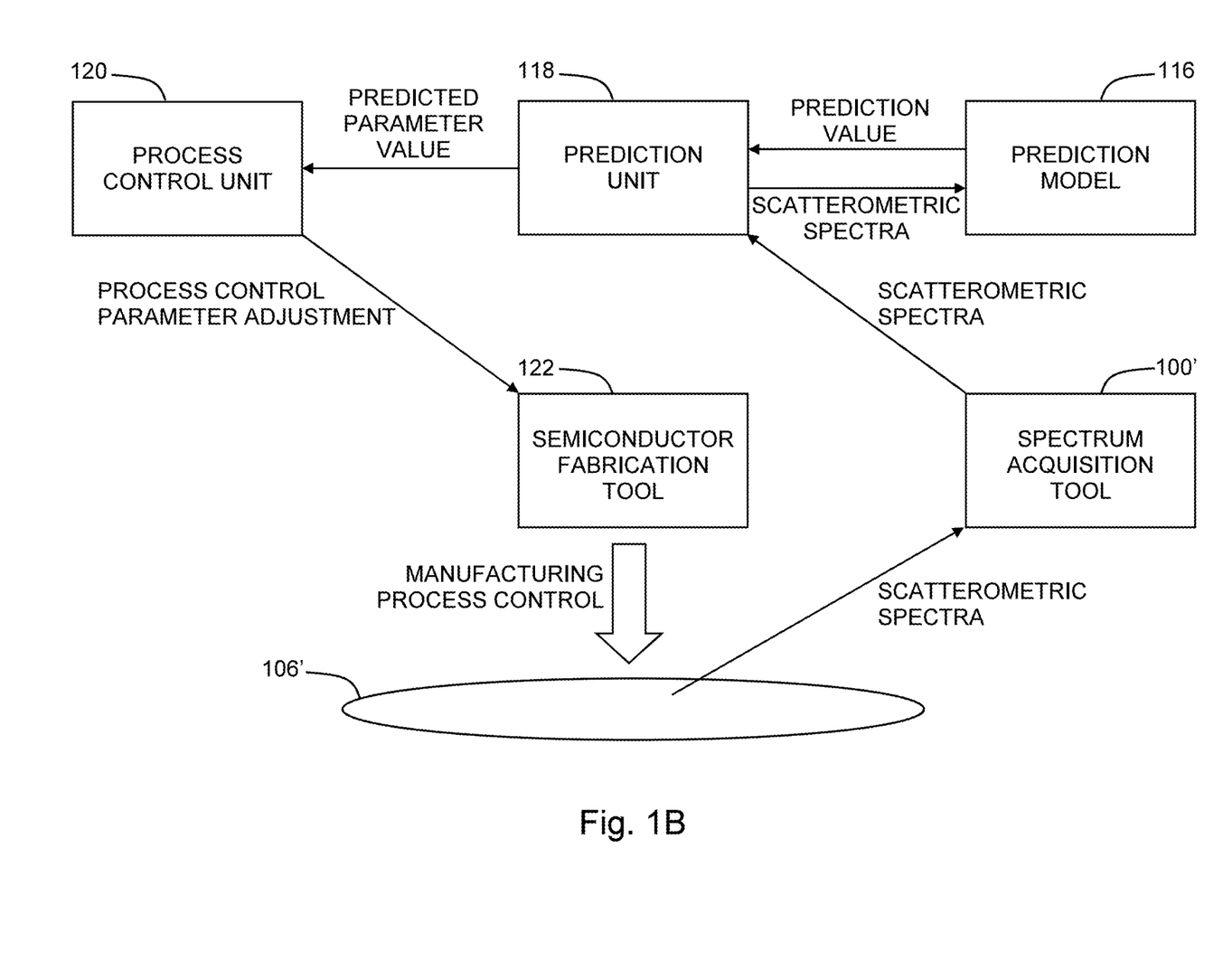

Reference is now made to FIGS. 1A and 1B, which, taken together, is a simplified conceptual illustration of a semiconductor metrology system, constructed and operative in accordance with an embodiment of the invention. In FIG. 1A, a spectrum acquisition tool 100 is employed to collect, in accordance with conventional techniques, scatterometric spectra 102 of multiple targets (e.g., structures, dies) 104 on one or more reference semiconductor wafers 106. Spectrum acquisition tool 100 collects scatterometric spectra 102, now referred to as baseline spectra 102, in accordance with a first predefined measurement protocol proximate to a selected processing step during fabrication of reference semiconductor wafers 106, such as just after completion of a given etch step. Spectrum acquisition tool 100 may be any known type of tool capable of collecting scatterometric spectra of semiconductor wafer targets, such as a Spectral Ellipsometer (SE), a Spectral Reflectometer (SR), a Polarized Spectral Reflectometer, or any other Optical Critical Dimension (OCD) metrology tool. The first predefined measurement protocol employed by spectrum acquisition tool 100 preferably incorporates scatterometric measurements from two or more channels of information.

A reference metrology tool 108, such as a Critical Dimension Scanning Electron Microscope (CD-SEM), an Atomic Force Microscope (AFM), a cross-section Tunneling Electron Microscope (TEM), an electric metrology tool, a Critical Dimension Atomic Force Microscope (CD-AFM), an X-RAY metrology tool, or an optical metrology tool, is employed to collect, in accordance with conventional techniques, measurement values 110 of predefined parameters of targets 104 on reference semiconductor wafers 106 in accordance with a second predefined measurement protocol proximate to the same selected processing step during fabrication of reference semiconductor wafers 106 at which spectrum acquisition tool 100 collected baseline spectra 102. The predefined parameters maybe any type of known parameter of semiconductor wafers, such as relating to their physical and chemical characteristics, material properties, electrical properties, and geometric properties of semiconductor wafer structures.

The first measurement protocol used by spectrum acquisition tool 100 and the second measurement protocol used by reference metrology tool 108 preferably differ from one another by in one or more of the following respects:

Different channels of information, such as where one protocol uses multiple signals from multiple channels of illuminations and at various illumination angles, while the other protocol only uses signals acquired while normally illuminating a given sample;

Different locations within the same sample, such as where one protocol uses signals acquired from spot target positions within area A of a given sample, while the other protocol uses signals acquired from spot target positions within area B of the same sample;

Different combinations of signals, such as where one protocol uses multiple, overlapping signals acquired via the same channels of illumination from multiple spot target positions, while the other protocol uses a single signal acquired from a single spot target position.

In addition to baseline spectra 102, spectrum acquisition tool 100 collects one or more sets of scatterometric spectra 112, now referred to as variability spectra 112, on one or more reference semiconductor wafers 106', which may be reference semiconductor wafers 106 or different semiconductor wafers, in accordance with the first predefined measurement protocol and proximate to the same selected processing step during fabrication of reference semiconductor wafers 106 at which spectrum acquisition tool 100 collected baseline spectra 102. Spectrum acquisition tool 100 collects each set of variability spectra 112 in association with a predefined source of spectral variability, such that the set of variability spectra 112 embodies the spectral variability. For example, where a predefined source of spectral variability relates to tool variability, spectrum acquisition tool 100 collects a set of variability spectra 112 by measuring a certain sample (e.g., collecting the spectra of a structure within a particular die on a particular wafer) using multiple, identical tools (i.e., the same model from the same manufacturer), all of which use the same measurement protocol. Similarly, where a predefined source of spectral variability relates to measurement repeatability, spectrum acquisition tool 100 collects a set of variability spectra 112 by measuring a certain sample (e.g., collecting the spectra of a structure within particular die on a particular wafer) at different points in time. Spectrum acquisition tool 100 collects any number of set of variability spectra 112 in association with any number of predefined sources of spectral variability.

A training unit 114 is configured to train a prediction model 116 by performing machine learning (ML) to identify correspondence between the scatterometric spectra collected by spectrum acquisition tool 100, i.e., baseline spectra 102 and the various sets of variability spectra 112, and the measurement values 110 of the predefined parameters of targets 104 on reference semiconductor wafers 106, while minimizing a loss function associated with the model. Prediction model 116 is configured to be used to predict values for any of the predefined parameters, such as using scatterometric spectra of semiconductor wafer targets during a high-volume manufacturing (HVM) process, where the spectra are collected using a spectrum acquisition tool in accordance with the first measurement protocol. An exemplary loss function is represented as $$\text{Loss} = \text{Loss}_{accuracy} + \Lambda_{rep}\text{Loss}_{rep} + \Lambda_{T2T}\text{Loss}_{T2T} + \ldots$$

where
$\text{Loss}_{accuracy} = \Sigma |y - \hat{y}(X)|^2$
$\text{Loss}_{rep} = \Sigma \text{Variance}(\hat{y})_{across\ repetitions}$
$\text{Loss}_{T2T} = \Sigma \text{Variance}(\hat{y})_{across\ tools}$
Here,
$\text{Loss}_{accuracy}$ is the loss term in consideration of baseline spectra 102 and measurement values 110
X—the spectra collected by the spectrum acquisition tool
y—the values of the predefined parameters that are the results of the metrology using the reference metrology tool
$\hat{y}(X)$—the prediction model that provides a prediction of y using spectra X
The sums all refer to a sum over unique physical samples (e.g., different dies on a wafer)
$\text{Variance}(\hat{y})_{across\ something}$ refers to the variance of the prediction $\hat{y}(X)$ calculated per sample (e.g., a particular die on a wafer) across the set of measurements done on that sample to reflect a specific source of variability. For example, $\text{Variance}(\hat{y})_{across\ repetitions}$ represents the variance of the prediction $\hat{y}(X)$ across 10 repeated measurements done on a the same die where the source of variability is measurement repeatability.

In the above loss function example, the power of 2 in $\text{Loss}_{accuracy}$ may be replaced with any positive power, and/or instead of $|y - \hat{y}(X)|^2$ any monotonously increasing function may be used. In the terms of type $\text{Loss}_{variability}$, any metric that represents the specific variability may be used, and not necessarily the variance, such as any higher statistical moment which describes the variability. Thus, for example, instead of using the variance of $\hat{y}$ (that is equal to $\langle(\hat{y} - \langle\hat{y}\rangle)^2\rangle)$, $\langle(\hat{y} - \langle\hat{y}\rangle)^p\rangle$ with any p>0 may be used instead, or any other moment of a monotonously increasing function of the difference between $\hat{y}$ and $\langle\hat{y}\rangle$.

The parameters $\Lambda$ represent hyperparameters of the prediction model 116 which determine the relative importance of suppressing the variability across the variability terms versus the importance of the accuracy term. These are preferably fixed during ML model training by methods of validation and cross-validation which optimize a user-defined recipe ranking that reflects predefined specifications, such as that of a user of the system of FIGS. 1A and 1B, in terms of accuracy, repeatability, tool matching, and any other functionalities that are important to the user.

Prediction model 116 is preferably provided for use with process control apparatus configured to control manufacture of semiconductor devices on semiconductor wafers, as is now described with reference to FIG. 1B.

In FIG. 1B, a spectrum acquisition tool 100', which may be spectrum acquisition tool 100 or another similar or identical spectrum acquisition tool, is employed during a production process, such as during a high-volume manufacturing (HVM) process of fabricating semiconductor devices on semiconductor wafers, to collect scatterometric spectra of a production semiconductor wafer 106'. Spectrum acquisition tool 100' collects scatterometric spectra in accordance with the first predefined measurement protocol and proximate to the same selected processing step during fabrication of reference semiconductor wafers 106 at which spectrum acquisition tool 100 collected baseline spectra 102. A prediction unit 118 applies prediction model 116 to the spectra collected from production semiconductor wafer 106' to produce a prediction value associated with any predefined parameter of any target of production semiconductor wafer 106' at that processing step, where the predefined parameter is any of the predefined parameters described hereinabove with reference to FIG. 1A. A process control unit 120, which may be any known process control hardware and/or software for controlling the process of fabricating semiconductor devices on semiconductor wafers, is configured to control the fabrication of production semiconductor wafer 106' or subsequent production semiconductor wafers in accordance with conventional techniques by providing input to any known semiconductor manufacturing tool 122 (e.g., lithography tool, etch tool, deposition tool, etc.) for controlling operation of the tool during the fabrication of production semiconductor wafer 106', where the input is determined in accordance with predefined protocols that use the prediction value.

The system of FIGS. 1A and 1B may thus be used to improve metrics such as tool stability and tool reproducibility by adding additional data during ML training of prediction model 116 that represents measurements of the same physical dies and wafers but from multiple tools (for the optimization of matching) and/or at multiple points in time (for the optimization of repeatability). These data relatively inexpensive to obtain as they do not require a reference value of a parameter. Once these data are acquired, prediction model 116 may be optimized such that it may be employed to simultaneously predict the reference value and have in-spec matching and repeatability. This is achieved by supplementing the Prediction model 116 standard loss function, that typically aims to minimize matching to reference, $\text{Loss} = L_{reference}$, by loss terms that reflect additional metrics, such as $\alpha \cdot L_{repeatability} + \beta \cdot L_{T2T}$, and use these terms' hyperparameter pre-factors, $\alpha$ and $\beta$, to balance accuracy versus productivity. Table 1 below presents experimental results of the invention showing improvement in repeatability across different "layers" (i.e., different measurements scenarios of different physical parameters at different types of semiconductor manufacturing steps) while accuracy remains reasonably unharmed.

TABLE 1

Optimizing accuracy vs repeatability.

| Application | Accuracy 1σ [Å] | Repeatability 1σ [Å] |
|---|---|---|
| Logic | 1.1→2.1 | 0.16→0.03 |
| | 7.4→8.8 | 1.5→0.3 |
| | 0.2→0.2 | 0.03→0.02 |
| | 0.5→0.6 | 0.17→0.04 |
| | 15.5→18.5 | 0.8→0.1 |
| | 5.6→6.4 | 0.17→0.04 |
| | 5.4→5.8 | 0.09→0.08 |

TABLE 1-continued

Optimizing accuracy vs repeatability.

| Application | Accuracy 1σ [A] | Repeatability 1σ [A] |
|---|---|---|
| Memory | 1.4→1.4 | 0.02→0.01 |
|  | 1.0→1.1 | 0.05→0.02 |

It will be appreciated that self-consistency merit, such as repeatability, T2T, wafer smoothness, etc., all improve the more strongly the model is regularized. This effect may be used to find an optimal point in the regularization scheme which balances accuracy and these other performance metrics. The hyperparameters that determine the improvement of the additional metrics may be automatically chosen using any suitable technique while maintaining the same accuracy.

Figure 2:
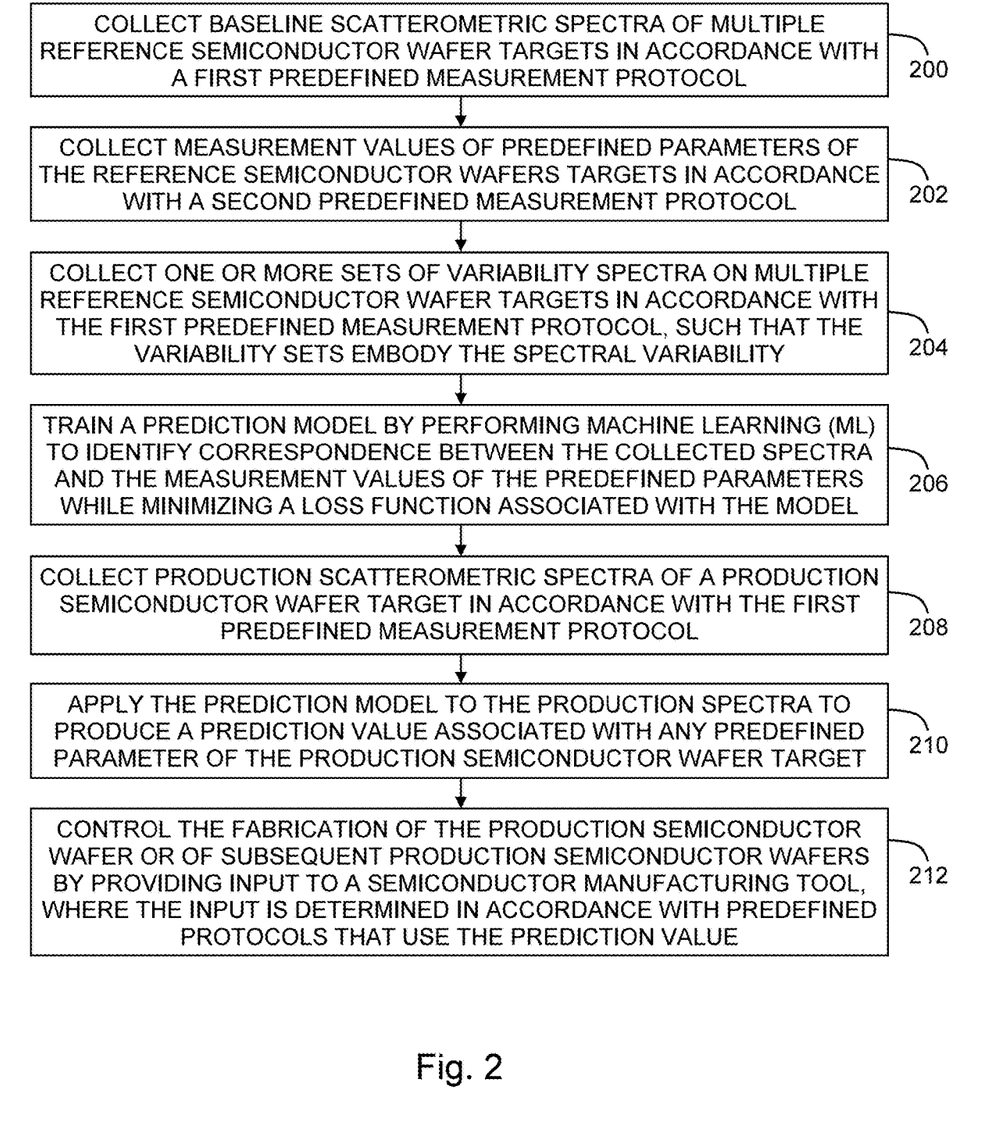
FIG. 2 is a simplified flowchart illustration of an exemplary method of operation of the system of FIGS. 1A and 1B, operative in accordance with various embodiments of the invention.

Reference is now made to FIG. 2 which is a simplified flowchart illustration of an exemplary method of operation of the system of FIGS. 1A and 1B, operative in accordance with an embodiment of the invention. In the method of FIG. 2, baseline spectra of multiple reference semiconductor wafer targets are collected in accordance with a first predefined measurement protocol (step 200). Measurement values of predefined parameters of the reference semiconductor wafers targets are collected in accordance with a second predefined measurement protocol (step 202). One or more sets of variability spectra are collected on multiple reference semiconductor wafer targets in accordance with the first predefined measurement protocol, such that the variability sets embody the spectral variability (step 204). A prediction model is trained by performing machine learning (ML) to identify correspondence between the collected spectra and the measurement values of the predefined parameters while minimizing a loss function associated with the model (step 206). Production scatterometric spectra of a production semiconductor wafer target are collected in accordance with the first predefined measurement protocol (step 208). The prediction model is applied to the production spectra to produce a prediction value associated with any predefined parameter of the production semiconductor wafer target (step 210). The fabrication of the production semiconductor wafer or of subsequent production semiconductor wafers is controlled by providing input to a semiconductor manufacturing tool, where the input is determined in accordance with predefined protocols that use the prediction value (step 212).

Sampling Enhancement

In an embodiment of the invention, sampling enhancement may be achieved by setting the signals S to be the set of signals measured on a relatively small number of semiconductor wafer dies, such as of 10-15 dies per wafer, and training prediction model 116 to predict the parameters P on more dies, such as of a full wafer map. The parameters used by process control unit 122 may, for example, be wafer model parameters such as the wafer mean or the polynomial parameters in a radial description of the wafer map. Table 2 below presents experimental results of the invention showing the accuracy of the wafer mean of a CMP thickness parameter in a BEOL application. The ground truth for the measurement was an RCWA interpretation of the NOVA T600® Advanced Optical CD Metrology tool, commercially available from Nova Measuring Instruments Ltd. of Rehovot, Israel, that measured a full wafer map of 65 dies. As shown, the spectra of 13 dies may be used together with ML to predict the mean of the full wafer map of 65 dies with a modest error of ~2.0 A-2.6 A, which is very close to the benchmark error chosen to be the error obtained had the wafer mean been calculated on the same dies used to collect the spectra.

TABLE 2

Initial results for sampling improvement.

| Optics used to collect spectra of 13 dies spectra for the ML inference | Error in the mean of the full wafer map [A] | The benchmark error in predicting the mean of the 13 dies measure by OCD [A] |
|---|---|---|
| NOVA T600 (6 Channels) | 2.0 | 1.9 |
| P and S Normal reflectance (2 channels) | 2.6 | 2.5 |

Better sampling and improved accuracy of sampling may also be achieved by basing the sampling strategy on measurements performed at the current layer and at previous layers, such that when previous layer measurements are used, sparse sampling in the different layers is optimized for improved full wafer map predictions of the current layer. Such methods may be used to predict the parameters as described hereinabove or by using variants of autoencoders and other deep learning up-sampling methods to predict the raw spectra itself on dies that have not been measured. According to this embodiment of the invention, total wafer information may be provided by measuring a small set of dies on the wafer.

Throughput Optimization by Reducing the Number of the Channels Measured

Figure 3A:
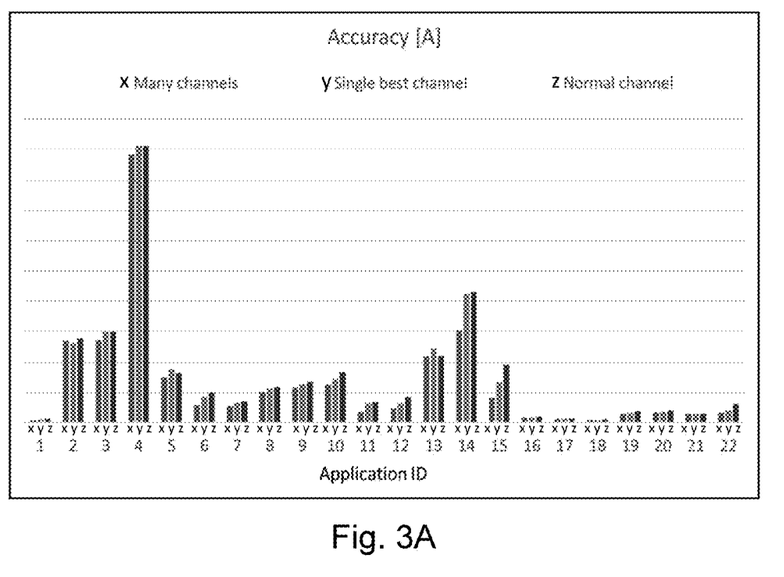
FIGS. 3A and 3B are simplified graphical illustrations presenting experimental results of the invention representing a survey of control elements over multiple layers and multiple parameters per layer.
Figure 3B:
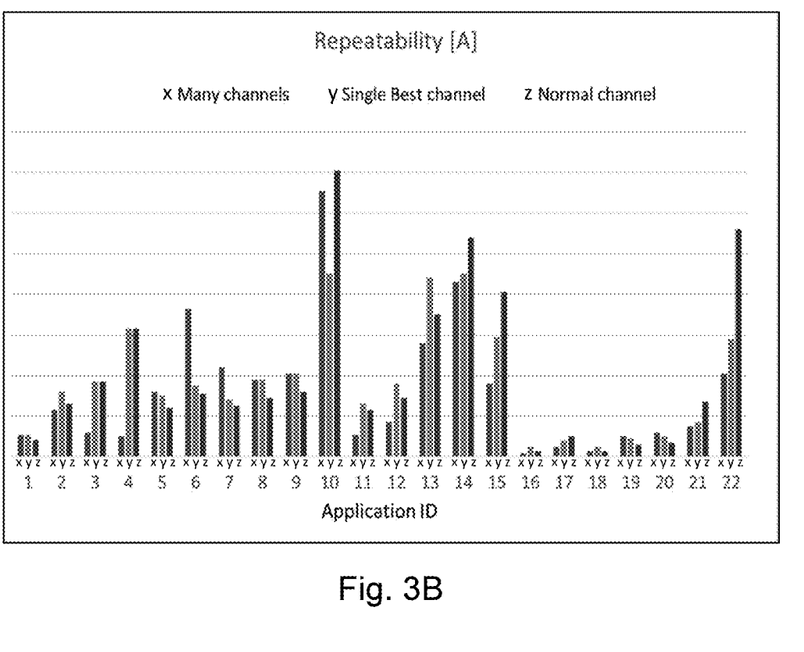

In an embodiment of the invention, metrology throughput (TPT) may be optimized by starting from a metrology recipe that contains many channels of measurement, obtaining reference values using ordinary physical modeling, and searching for a smaller number of channels whose TPT is better (e.g., the two normal channels only), and to which one can 'transfer' the solution with a good balance of accuracy and throughput. This effect in shown in FIGS. 3A and 3B which present experimental results of the invention representing a survey of 22 control elements over 7 layers and multiple parameters per layer. In FIGS. 3A and 3B reference values were provided either physical modeling or an external reference tool such as a CDSEM and a TEM. As FIGS. 3A and 3B show, a transfer of many channels to a single channel is possible without resulting in a serious penalty to accuracy (FIG. 3A) and repeatability (FIG. 3B). This allows a TPT increase of 3×-4×.

According to this embodiment of invention, training unit 114 automatically selects the optimal channels constrained to have a user-defined or otherwise predefined desired throughput.

Methods of Handling a Limited Amount of Reference Data
Direct Process Control

In an embodiment of the invention, tool knob control solutions, such as may be used by Advanced Process Control (APC) systems used in semiconductor manufacturing, are provided for two levels of variation source: within processing wafer (batch) and wafer-to-wafer variation (batch to batch). ML can be used to directly control process parameters by first obtaining a set of signals S that are measured over a range of recipe parameters for the process tool (e.g., a DOE on knobs controlling CMP time or etch temperature). Prediction model 116 is then trained to learn and calibrate the OCD signals to the tool knobs. Prediction model 116 can then be used to predict an effective knob setting which may be used as feedback to the tool knobs.

Figure 4A:
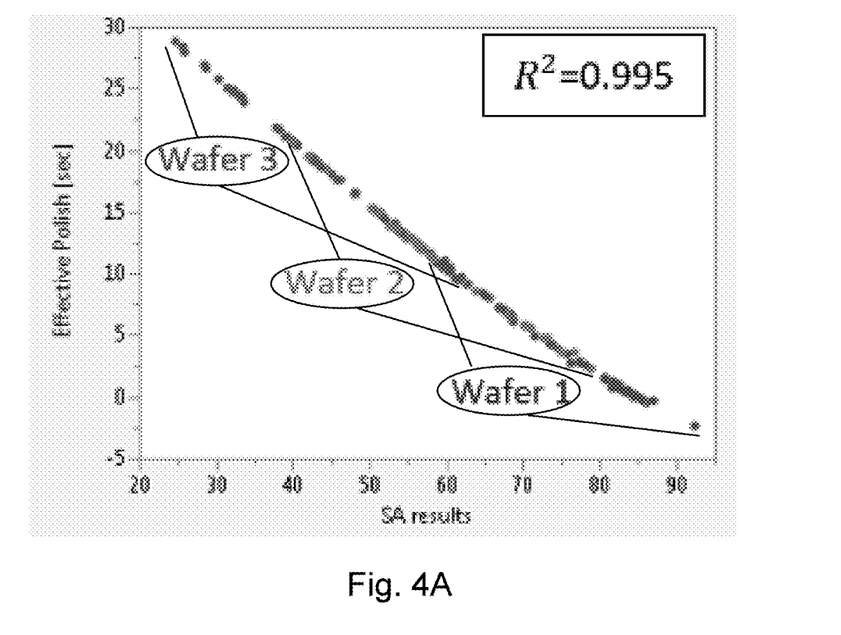
FIGS. 4A and 4B are simplified graphical illustrations presenting experimental results of the invention showing how a DOE in polish time and in intended remaining thickness were learned by the prediction model of the invention.
Figure 4B:
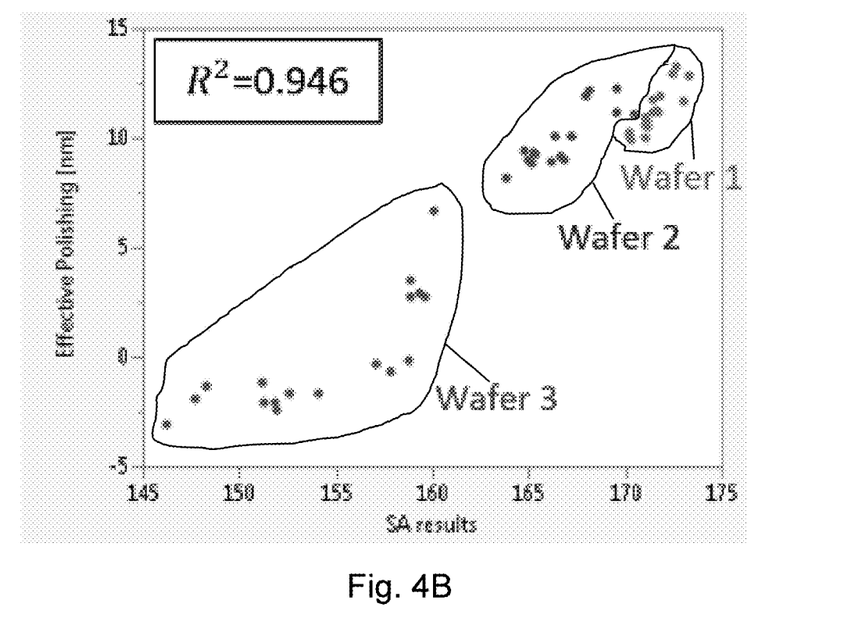

Given two groups of signals with two different DOE levels, and the DOE levels as reference, training unit 114 employs ML to extract the spectral response to knob change, hence the spectral sensitivity to the knob. Training unit 114 tracks any spectral difference between the groups, where the nominal of the groups is preferably as close as possible, so that the knob effect will be the dominating one. A future process can then be adjusted according to the learned relation to achieve a desired target result of a parameter or to adjust process and tool drifts to prevent potential failures. This effect in shown in FIGS. 4A and 4B which present experimental results of the invention showing how a DOE in polish time (FIG. 4A) and in intended remaining thickness (FIG. 4B) were learned by prediction model 116 using the IM spectra. FIGS. 4A and 4B show that despite the wafer-level uniformity of the DOE, the 'effective knob' captures the WIW variability (i.e., the model predicts a range of effective knob settings for each wafer). To verify that this effective knob technique is useful, it is presented versus the external ground truth for the target remaining thickness as measured by a physical algorithm using NOVA T600®-MMSR Advanced Optical CD Metrology tool, commercially available from Nova Measuring Instruments Ltd. of Rehovot, Israel. Such a model can be used to feedback to process tools that have WIW knobs. As shown in FIG. 4A, predicted effective polish time ('effective knob') is highly correlated to the ground truth polished layer thickness, whereas FIG. 2B shows predicted polish thickness effect vs. reference.

Data Augmentation

Simple ML algorithms do not contain prior knowledge on the underlying physics they aim to describe. This means that their success is predicated on the availability of data, and more specifically, the availability of reference data. In an embodiment of the invention, the size of the training set of data used to train prediction model 116 is increased by means of generative models, which are a class of ML methods that have the ability of describing a highly complex probability distribution of data. A simple physical analogy is the Boltzmann weight in statistical physics or the path integral formalism for Euclidean quantum theories. In both cases, a probability function is defined that describes the behavior of the system's degrees of freedom (e.g., spins in statistical physics or electrons in quantum electrodynamics). These probability functions have an explicit form and can be used to generate realizations of the physics involved. Indeed, in many fields of physics, such formalisms are used in large scale Markov chain Monte-Carlo simulations to calculate physical properties of matter. Generative models in data science may be explicit or implicit, where in explicit models the probability function is explicitly stated (same as the Boltzmann weight), while in implicit models an algorithm 'learns' the statistics of an empirical data set and is then able to generate new data examples with the same statistics. Examples of implicit methods include Variational Auto Encoders and Generative Adversarial Networks. In an embodiment of the invention these methods are used to increase and diversify the reference data set, thereby optimizing performance of training unit 114 and enabling the insertion of prior information and constraints between the different features of the machine learning model that reflect the underlying physics into prediction model 116.

Solving Process Robustness

To solve process robustness, in an embodiment of the invention a combination of ML algorithms and a big data system are employed which will create recipes, as well as monitor and control them, as follows:

Recipe training: Enabling the user to query training data within a big data database that may span hundreds of spectra types ('measurement recipes') and over periods of many months and perhaps years, using ML and as automatically as possible.

Recipe validation: Generating customer feedback regarding recipe quality using cross-validation and blind test methodologies.

Recipe monitoring: Using training data to generate monitor defense indices together with specifications for these indices. These indices are then monitored inline to flag when the accuracy of a recipe degrades, such as, for example, by adapting the SEMI standard SPC rules.

Recipe updating: once a monitor flags a metrology recipe for repair, an automatic retraining sequence is initiated, and a new recipe is automatically proposed, together with its validation results.

Figure 5A:
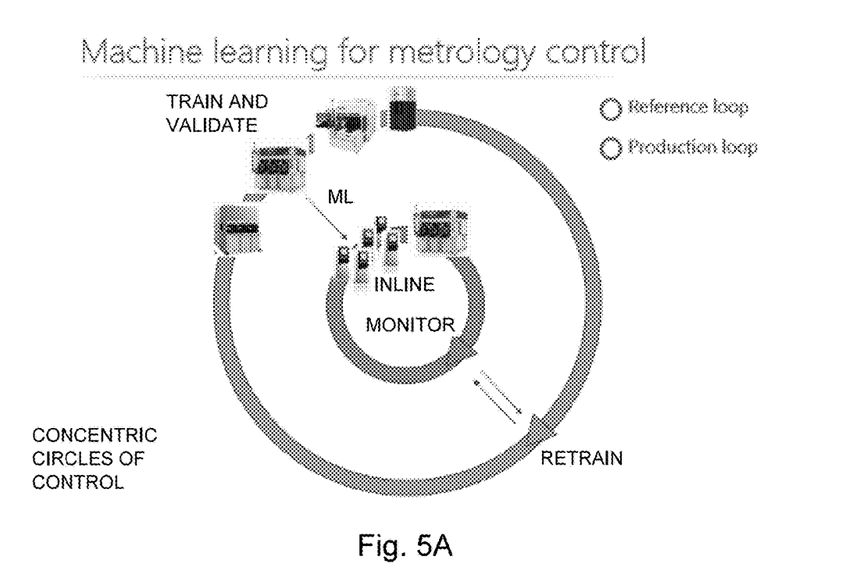
FIGS. 5A and 5B are simplified conceptual illustrations of system architectures for implementing embodiments of the invention.

This embodiment is depicted in FIG. 5A, where the outer circle represents a reference tool, which may be a high-end, channel-rich optical metrology tool like the NOVA T600®-MMSR, or a non-optical reference such as XPS, SEM, or TEM. Typically, these tools have higher COO also reflected by lower TPT and non-trivial productivity challenges like destructiveness, tool matching, repeatability, etc. Accuracy-wise, these tools are characterized by high information content (e.g., high-resolution imaging tools or multi-channeled optical tools). The inner circle represents a fast and compact OCD tool like the NOVA i550® normal incidence channel integrated metrology (IM) tool, commercially available from Nova Measuring Instruments Ltd. of Rehovot, Israel, which has a high throughput and the ability to measure in-line every wafer with a required sampling rate (number of dies), together with ML algorithms which run inline, whose input is $S_{inner-circle}$, and that output a prediction for $P_{reference}$.

System Architecture

Figure 5B:
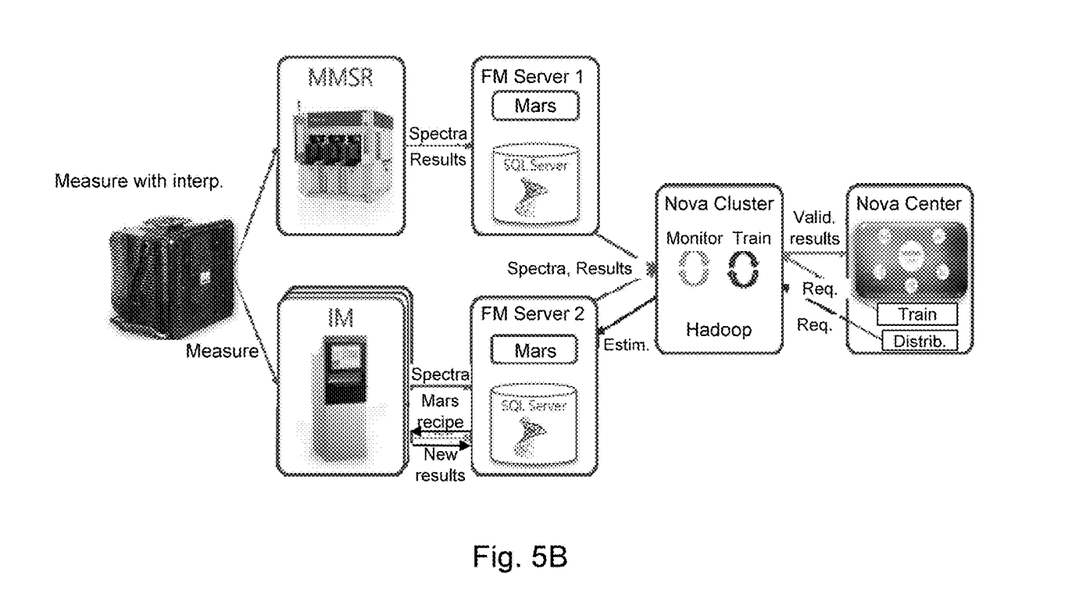

FIG. 5B shows an architecture for implementing one or more embodiments of the invention described herein, in which a computer cluster includes a web server layer (e.g., NodeJS™) and a big data layer (e.g., Hadoop™ Cluster, commercially available from Apache Software Foundation, of Forest Hill, Md.). The big data layer provides for storing and processing data in a scalable and distributed manner. The web server layer allows the user to define processing jobs in the control system and view control system reports and execution statuses. Both layers are designed using a micro-services approach to achieve scalability, high availability and load balancing. Message queues are used to communicate between the services to reduce tight coupling. Various data preprocessing pipelines are employed to improve the performance of the big data layer.

Data Size and Long-Term Process Robustness

Figure 6A:
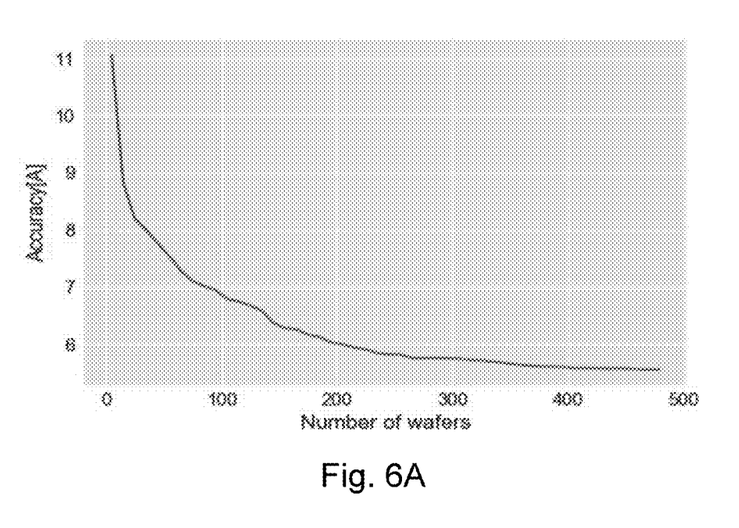
FIGS. 6A and 6B are simplified graphical illustrations presenting experimental results of the invention showing examples of improved accuracy performance of the prediction model of the invention.
Figure 6B:
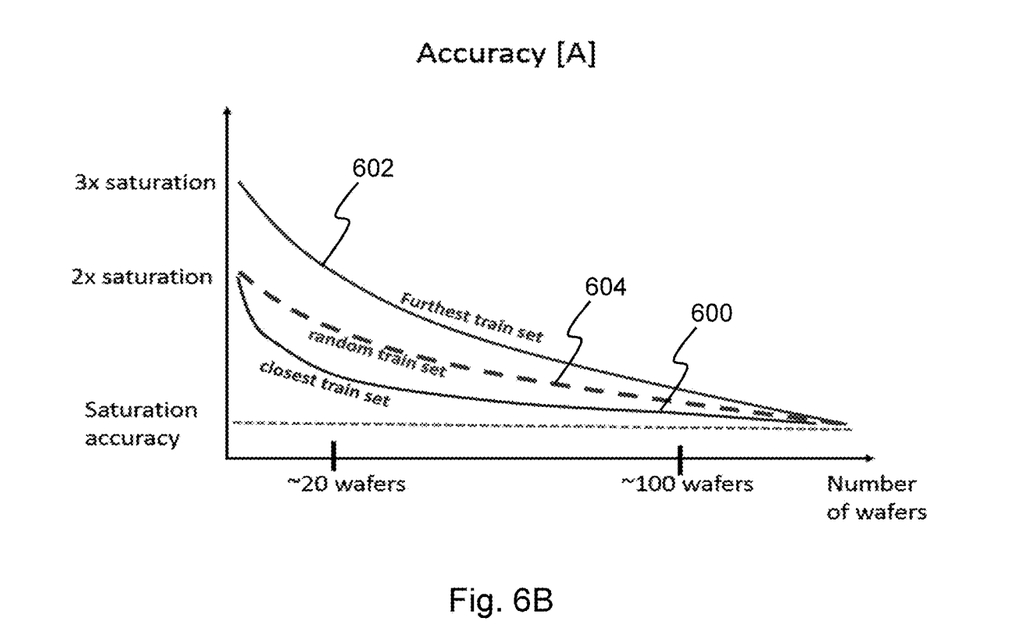

Having a big data system allows for increased amounts of available training data for training prediction model 116, as well as for improving and updating prediction model 116 in real-time, which removes accuracy limitations due to data management overhead and ensures long-term process robustness. In FIGS. 6A and 6B shows two examples of improved accuracy performance of prediction model 116 as applied to the FEOL layer. Here, the reference was a physical model developed on the NOVA T600®-MMSR, where prediction model 116 used two normal channels for inference. The plots show the way the accuracy of prediction model 116, defined to be the 1$a$ of blind test results across ~2000 dies, depends on the number of wafers used to train the model, where each wafer has ~15 dies. As FIG. 6A shows, accuracy may be improved by 45% (13 A→6 A)

when increasing the train size from 5 wafers to 200. Saturating at such a large sample is atypical and we often see good results on tens on sites provided a DOE is present. FIG. 6B shows a different situation, where the accuracy of prediction model 116 strongly depends on which data is used to train it, and not only how much data is used. Specifically, FIG. 6*b* shows that when trained with ~20 wafers that are closest in time to blind test wafers (as shown by a curve 600), the model converged to the same level of accuracy as when it is trained with 100 wafers that are furthest away from the blind test (as shown by a curve 602). In between these curves lies the benchmark curve (as shown by a curve 604) which describes a random shuffle of the data so as to 'lose' memory of the importance of time. This indicates that the type of wafers is important, and that this application would benefit from a dynamic update of the ML recipe which the big data system of the current embodiment enables.

Figure 7:
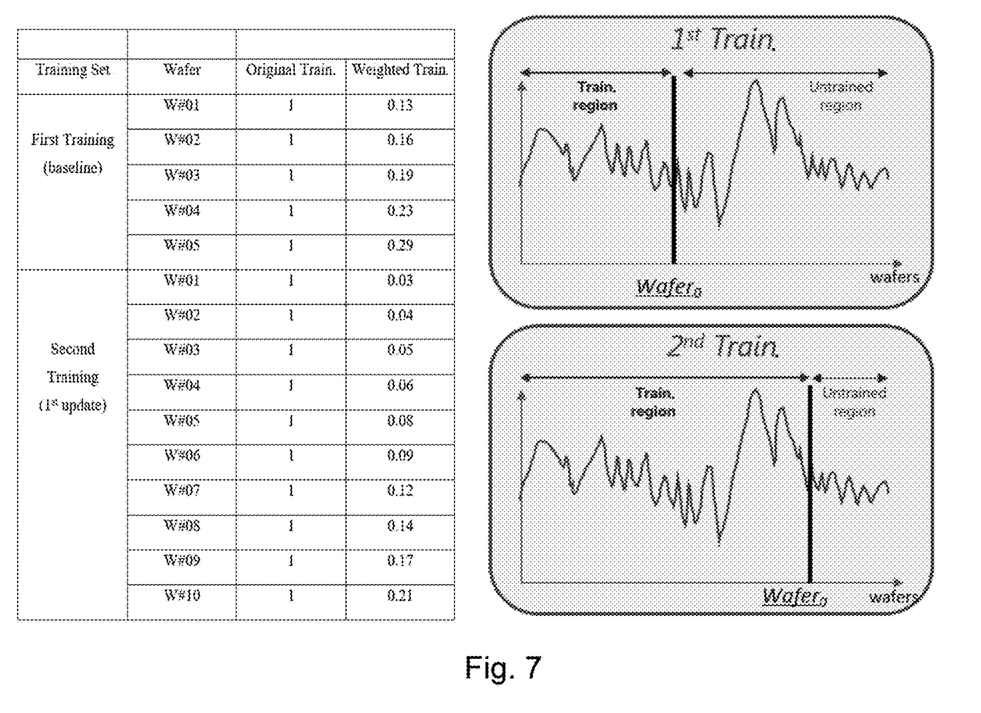
FIG. 7 is simplified graphical illustration presenting experimental results of the invention relating to training the prediction model of the invention.

The recipe update step described hereinabove is performed automatically, as is the choice of data used to perform the retraining. Such a choice can be to use all available data, or can be based on logic that considers the value of the monitor flags for each wafer and/or the proximity in time or in process space of a given wafer to other wafers being processed. For example, a different weight p may be set for each wafer in the data available for retraining. The weight p may depend on the flag value of that wafer, on the spectra itself, and/or on other metadata characteristics like wafer and lot ID. This is shown FIG. 7.

Any aspect of the invention described herein may be implemented in computer hardware and/or computer software embodied in a non-transitory, computer-readable medium in accordance with conventional techniques, the computer hardware including one or more computer processors, computer memories, I/O devices, and network interfaces that interoperate in accordance with conventional techniques.

It is to be appreciated that the term "processor" or "device" as used herein is intended to include any processing device, such as, for example, one that includes a CPU (central processing unit) and/or other processing circuitry. It is also to be understood that the term "processor" or "device" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

Embodiments of the invention may include a system, a method, and/or a computer program product. The computer program product may include a computer readable storage medium (or media) having computer readable program instructions thereon for causing a processor to carry out aspects of the invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the invention.

Aspects of the invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart illustrations and block diagrams in the drawing figures illustrate the architecture, functionality, and operation of possible implementations of systems, methods, and computer program products according to various embodiments of the invention. In this regard, each block in the flowchart illustrations or block diagrams may represent a module, segment, or portion of computer instructions, which comprises one or more executable computer instructions for implementing the specified logical function(s). In some alternative implementations, the functions noted in a block may occur out of the order noted in the drawing figures. For example, two blocks shown in succession may, in fact, be executed substantially concurrently, or the blocks may sometimes be executed in the reverse order, depending upon the functionality involved. It will also be noted that each block of the flowchart illustrations and block diagrams, and combinations of such blocks, can be implemented by special-purpose hardware-based and/or software-based systems that perform the specified functions or acts.

The descriptions of the various embodiments of the invention have been presented for purposes of illustration, but are not intended to be exhaustive or limited to the embodiments disclosed. For example, the systems and methods described herein are applicable to any type of structure on semiconductor wafers. Many modifications and variations will be apparent to those of ordinary skill in the art without departing from the scope and spirit of the described embodiments.

What is claimed is:

1. A semiconductor metrology method comprising:
    collecting, using a spectrum acquisition tool and in accordance with a first measurement protocol, a baseline set of spectra on a first set of semiconductor wafer targets;
    collecting, using a reference metrology tool and in accordance with a second measurement protocol, values of predefined parameters of the first set of semiconductor wafer targets;
    for each of one or more predefined sources of spectral variability, collecting a variability set of spectra using the spectrum acquisition tool, and in accordance with the first measurement protocol, on a second set of semiconductor wafer targets corresponding to the first set of semiconductor wafer targets, wherein the variability set of spectra embodies the spectral variability;
    creating a training set of data from the collected sets of spectra and parameter values;
    using one or more generative models to increase the size of the training set of data; and
    using the training set of data to train a prediction model using machine learning and minimize a loss function associated with the prediction model,
        wherein the prediction model is configured to be used to predict values for any of the predefined parameters using production spectra of a third set of semiconductor wafer targets, wherein the production spectra are collected using the spectrum acquisition tool and in accordance with the first measurement protocol, and
        wherein the loss function is minimized by incorporating, for each of the one or more predefined sources of spectral variability, a term representing the spectral variability.

2. The method according to claim 1 wherein any of the generative models employs a predefined probability function that provides a probability distribution of the data in the training set, and generates new data examples using the probability function, thereby increasing the size of the training set of data.

3. The method according to claim 2 wherein the probability function is explicitly stated.

4. The method according to claim 1 wherein any of the generative models employs a predefined algorithm to determine statistics of the data in the training set and generating new data examples having the same statistics, thereby increasing the size of the training set of data.

5. The method according to claim 4 wherein any of the generative models is a variational autoencoder.

6. The method according to claim 4 wherein any of the generative models employs a generative adversarial network.

7. The method according to claim 1 and further comprising inserting into the prediction model any information and constraints between different features of any of the generative models that reflect underlying physics of the semiconductor wafer targets.

8. The method according to claim 1 wherein the predefined parameters relate to any of physical and chemical characteristics, material properties, electrical properties, and geometric properties of structures at the semiconductor wafer targets.

9. The method according to claim 1 wherein the reference metrology tool is any of a Spectral Ellipsometer (SE), a Spectral Reflectometer (SR), a Polarized Spectral Reflectometer, and an Optical Critical Dimension (OCD) metrology tool.

10. The method according to claim 1 wherein any of the tools are configured for used in an Integrated Metrology system.

11. A semiconductor metrology system comprising:
    a spectrum acquisition tool configured to
        collect, in accordance with a first measurement protocol, a baseline set of scatterometric spectra on a first set of semiconductor wafer targets, and for each of one or more predefined sources of spectral variability, collect, in accordance with the first measurement protocol, a variability set of scatterometric spectra on a second set of semiconductor wafer targets corresponding to the first set of semiconductor wafer targets, wherein the variability set of spectra embodies the spectral variability;

a reference metrology tool configured to collect, in accordance with a second measurement protocol, values of predefined parameters of the first set of semiconductor wafer targets;

a training unit configured to
create a training set of data from the collected sets of spectra and parameter values,
using one or more generative models to increase the size of the training set of data, and
use the training set of data to train a prediction model using machine learning and minimize a loss function associated with the prediction model,
wherein the prediction model is configured to be used to predict values for any of the predefined parameters using production spectra of a third set of semiconductor wafer targets, wherein the production spectra are collected using the spectrum acquisition tool and in accordance with the first measurement protocol, and
wherein the loss function is minimized by incorporating, for each of the one or more predefined sources of spectral variability, a term representing the spectral variability.

12. The system according to claim 11 wherein any of the generative models employs a predefined probability function that provides a probability distribution of the data in the training set, and generates new data examples using the probability function, thereby increasing the size of the training set of data.

13. The system according to claim 12 wherein the probability function is explicitly stated.

14. The system according to claim 11 wherein any of the generative models employs a predefined algorithm to determine statistics of the data in the training set and generating new data examples having the same statistics, thereby increasing the size of the training set of data.

15. The system according to claim 14 wherein any of the generative models is a variational autoencoder.

16. The system according to claim 14 wherein any of the generative models employs a generative adversarial network.

17. The system according to claim 11 and further comprising inserting into the prediction model any information and constraints between different features of any of the generative models that reflect underlying physics of the semiconductor wafer targets.

18. The system according to claim 11 wherein the predefined parameters relate to any of physical and chemical characteristics, material properties, electrical properties, and geometric properties of structures at the semiconductor wafer targets.

19. The system according to claim 11 wherein the reference metrology tool is any of a Spectral Ellipsometer (SE), a Spectral Reflectometer (SR), a Polarized Spectral Reflectometer, and an Optical Critical Dimension (OCD) metrology tool.

20. The system according to claim 11 wherein any of the tools are configured for used in an Integrated Metrology system.

* * * * *